US012777739B2

(12) United States Patent
Escarra et al.

(10) Patent No.: US 12,777,739 B2
(45) Date of Patent: Oct. 27, 2026

(54) LARGE-AREA SCHOTTKY-JUNCTION PHOTOVOLTAICS USING TRANSITION-METAL DICHALCOGENIDES

(71) Applicant: THE ADMINISTRATORS OF THE TULANE EDUCATIONAL FUND, New Orleans, LA (US)

(72) Inventors: Matthew David Escarra, New Orleans, LA (US); Kazi M. Islam, New Orleans, LA (US); Timothy Ismael, New Orleans, LA (US)

(73) Assignee: THE ADMINISTRATORS OF THE TULANE EDUCATIONAL FUND, New Orleans, FL (US)

( * ) Notice: Subject to any disclaimer, the term of this patent is extended or adjusted under 35 U.S.C. 154(b) by 78 days.

(21) Appl. No.: 18/865,052

(22) PCT Filed: May 19, 2023

(86) PCT No.: PCT/US2023/022955
§ 371 (c)(1),
(2) Date: Nov. 12, 2024

(87) PCT Pub. No.: WO2023/239543
PCT Pub. Date: Dec. 14, 2023

(65) Prior Publication Data

US 2025/0311472 A1 Oct. 2, 2025

Related U.S. Application Data

(60) Provisional application No. 63/343,670, filed on May 19, 2022.

(51) Int. Cl.
*H10F 77/20* (2025.01)
*H10F 10/18* (2025.01)

(52) U.S. Cl.
CPC ........... *H10F 77/219* (2025.01); *H10F 10/18* (2025.01)

(58) Field of Classification Search
None
See application file for complete search history.

(56) References Cited

U.S. PATENT DOCUMENTS

| | | | |
|---|---|---|---|
| 8,766,330 | B2 | 7/2014 | Paranjape et al. |
| 9,608,101 | B2 | 3/2017 | Kis et al. |

(Continued)

FOREIGN PATENT DOCUMENTS

| | | | |
|---|---|---|---|
| CN | 105271800 | A | 1/2016 |
| WO | 2020035695 | A1 | 2/2020 |
| WO | 2021015677 | A1 | 1/2021 |

OTHER PUBLICATIONS

International Search Report and Written Opinion in corresponding PCT Application No. PCT/US23/22955, mailed J Jan. 19, 2024, 7 pages.

(Continued)

*Primary Examiner* — Eli S Mekhlin
(74) *Attorney, Agent, or Firm* — Bell & Manning, LLC

(57) ABSTRACT

An optoelectronic device includes a thin film of a transition-metal dichalcogenide, a first electrode made of a first metal directly contacting the thin film, and a second electrode made of a second metal directly contacting the thin film. The first metal is molybdenum, titanium, aluminum, tantalum, scandium, or yttrium. The second metal is platinum, nickel, palladium, gold, or cobalt. Depending on the type and doping of the transition-metal dichalcogenide, one of the first and second metals forms an electron selective layer with the transition-metal dichalcogenide and the other of the first and second metals forms a hole selective layer with the transition-metal dichalcogenide. The thin film may be a monolayer or multilayer. The transition-metal dichalco- (Continued)

genide may be molybdenum disulfide. The thin film may be grown via chemical vapor deposition and have an area of 0.25 $cm^2$ or more.

20 Claims, 11 Drawing Sheets

(56) References Cited

U.S. PATENT DOCUMENTS

| | | | | |
|---|---|---|---|---|
| 2013/0105824 | A1* | 5/2013 | Paranjape | H10F 10/18 257/E31.026 |
| 2015/0369928 | A1* | 12/2015 | Reese | G01T 1/2006 250/362 |
| 2018/0172908 | A1 | 6/2018 | Bao et al. | |
| 2021/0143188 | A1* | 5/2021 | Lee | H10D 86/60 |

OTHER PUBLICATIONS

Nazif et al. "High-performance p-n junction transition metal dichalcogenide photovoltaic cells enabled by MoO x doping and passivation." Nano letters 21.8 (2021 ): 3443-3450 [on line] Apr. 14, 2021 (Apr. 14, 2021) (retrieved on Nov. 16, 2023]. Retrieved from the Internet: <DOI: 10.1021/acs. nanolett.1c00015 > <URL: https://pubs.acs.org/doi/abs/10.1021/acs.nanolett.1 c00015>.

Fontana et al., Electron-hole transport and photovoltaic effect in gated MoS2 Schottky junctions, Scientific Reports | 3 : 1634 | DOI: 10.1038/srep01634, Published Apr. 9, 2013, 6 pages.

Islam et al., In-Plane and Out-of-Plane Optical Properties of Monolayer, Few-Layer, and Thin-Film MoS2 from 190 to 1700 nm and Their Application in Photonic Device Design, Adv. Photonics Res. 2021, 2, DOI: 10.1002/adpr.202000180, 11 pages, Advanced Photonics Research published by Wiley-VCH GmbH.

Went et al., A new metal transfer process for van der Waals contacts to vertical Schottky-junction transition metal dichalcogenide photovoltaics, Went et al., Sci. Adv. 2019; 5 : eaax6061 Dec. 20, 2019, 8 pages.

Islam et al., Large-Area, High-Specific-Power Schottky-Junction Photovoltaics from CVD-Grown Monolayer MoS2, ACS Appl. Mater. Interfaces 2022, 14, 24281-24289.

Bernardi et al., Extraordinary Sunlight Absorption and One Nanometer Thick Photovoltaics Using Two-Dimensional Monolayer Materials, dx.doi.org/10.1021/nl401544y | Nano Lett. 2013, 13, 3664-3670.

Nazif et al., High-specific-power flexible transition metal dichalcogenide solar cells, Nature Communications | (2021) 12:7034 | https://doi.org/10.1038/s41467-021-27195-7.

Shanmugam et al., Layered semiconductor molybdenum disulfide nanomembrane based Schottky-barrier solar cells, Nanoscale, 2012, 4, 7399.

Akama et al., Schottky solar cell using fewlayered transition metal dichalcogenides toward large-scale fabrication of semitransparent and flexible power generator, Scientific Reports | 7: 11967 | DOI: 10.1038/s41598-017-12287-6, Published online Sep. 20, 2017.

Choi et al., Lateral MoS2 p-n Junction Formed by Chemical Doping for Use in High-Performance Optoelectronics, Article in ACS Nano · Aug. 2014, DOI: 10.1021/nn503284n · Source: PubMed, vol. 8 'No. 9 ' 9332-9340 ' 2014.

* cited by examiner

LARGE-AREA SCHOTTKY-JUNCTION PHOTOVOLTAICS USING TRANSITION-METAL DICHALCOGENIDES

RELATED APPLICATIONS

This application claims priority to U.S. Provisional Patent Application No. 63/343,670, filed on May 19, 2022, the entirety of which is incorporated herein by reference.

STATEMENT REGARDING FEDERALLY SPONSORED RESEARCH OR DEVELOPMENT

This invention was made with government support under DMR1727000 awarded by the National Science Foundation and 80NSSC19M0055 awarded by the National Aeronautics and Space Administration (NASA). The government has certain rights in the invention.

BACKGROUND

The deployment of two-dimensional (2D) materials for solar energy conversion benefits from the ability to manufacture and fabricate scalable large-area photovoltaic devices. The strong light-matter interaction in 2D transition-metal dichalcogenides like molybdenum disulfide ($MoS_2$) results in high absorption and photogeneration in these materials, making them suitable for flexible and ultra-light photovoltaics and other optoelectronic devices. Two-dimensional photovoltaics may be used in weight and volume constrained applications, such as space-based, building-integrated, or vehicle-integrated solar energy conversion.

SUMMARY

The present embodiments include monolayer $MoS_2$-based lateral Schottky-junction photovoltaic (PV) devices grown using chemical vapor deposition (CVD). To date, all demonstrations of PV devices utilizing van-der-Waals-stacked transition-metal dichalcogenides (TMDCs) have utilized small (~0.0025 $mm^2$ in the largest reported case) exfoliated flakes. In the present disclosure, we demonstrate a lateral Schottky-junction PV device with CVD-grown monolayer $MoS_2$ and Au/Ti and Pt contacts. This is the first work to report a two-dimensional (2D) PV device performance using CVD-grown, large-area, scalable, 2D materials, a pre-requisite for practical deployments of 2D PV for solar energy conversion.

Schottky-junction PV cells are different from traditional p-n junction solar cells in terms of how their built-in voltage is formed. In a conventional solar cell, p-type and n-type semiconductor materials are brought together to form a p-n junction. Due to the offsets in the p-type and n-type materials' Fermi levels, a built-in potential difference is created, resulting in electron-hole pair carrier separation. In a Schottky-junction solar cell, however, the built-in voltage is formed by the offset between the Fermi level of the semiconductor and the work functions of the metal contacts. At the interface between the semiconductor and metal, band bending happens due to this offset, and a so-called Schottky barrier may be formed. To drive carrier separation in a Schottky-junction solar cell, two different metals for the contacts may be chosen such that one metal aligns to the conduction band of the semiconductor for electron collection while the other metal aligns to the valence band for hole collection.

One aspect of the present embodiments is the realization that the open-circuit voltage of a Schottky-junction PV cell can be increased by making the electrodes from a pair of metals that are increasingly asymmetric. Specifically, one of the electrodes is made from a metal whose work function is large compared to that of the semiconductor while the other is made from a metal whose work function is small compared to that of the semiconductor. The greater the difference between the work function of a metal and the work function of the semiconductor, the larger the potential-energy barrier the metal forms (for electrons or holes). Importantly, creating a large barrier for electrons (i.e., a Schottky barrier) at one electrode and a large barrier for holes at the other electrode helps to separate holes and electrons with minimal, if any, recombination occurring at or near the semiconductor. Such recombination produces heat, thereby increasing energy loss and reducing the efficiency of the PV cell.

As discussed in more detail below, a one-dimensional finite element analysis model was used to study the band structure of $MoS_2$ and identify metals that, when placed in direct contact with the $MoS_2$, induce band bending to create large barriers for electrons and holes. Metals that were found to have large work functions, and therefore form large Schottky barriers for blocking electrons, include platinum (Pt), nickel (Ni), palladium (Pd), gold (Au), and cobalt (Co). Metals that were found to have small work functions, and therefore form large barriers for blocking holes, include molybdenum (Mo), titanium (Ti), aluminum (Al), tantalum (Ta), scandium (Sc), and yttrium (Y). These metals may also be used as electrodes for PV cells using another type of TMDC (e.g., $MoTe_2$, $WSe_2$, $MoSe_2$, $WS_2$, etc.).

In certain embodiments, an optoelectronic device includes a thin film of a TMDC, a first electrode made of a first metal directly contacting the thin film, and a second electrode made of a second metal directly contacting the thin film. The first metal is molybdenum, titanium, aluminum, tantalum, scandium, or yttrium. The second metal is platinum, nickel, palladium, gold, or cobalt. Depending on the type and doping of the TMDC, one of the first and second metals forms an electron selective layer with the TMDC and the other of the first and second metals forms a hole selective layer with the TMDC. The thin film may be a monolayer or multilayer. The TMDC may be $MoS_2$, $MoTe_2$, $WSe_2$, $MoSe_2$, or $WS_2$. The thin film may be grown via CVD. The thin film may have an area of 0.25 $cm^2$ or more.

Another aspect of the present embodiments is the realization that holes and electrons can scatter and recombine within the semiconductor during diffusion. This scattering and recombination reduces the current collection, and therefore negatively impacts device performance. To combat this effect, some of the present embodiments include a geometry in which the two metal electrodes are shaped as interdigitated fingers. With this geometry, every point of the semiconductor thin film is located less that a maximum distance from the electrodes. When this maximum distance is, for example, set to the diffusion length of the carriers in the semiconductor, the holes and electrons can reach the electrodes with minimal scattering and recombination. It has been discovered that this reduced scattering and recombination can be achieved for maximum distances from the electrodes that are up to approximately five times the diffusion length.

In certain embodiments, an optoelectronic device includes a thin film of a TMDC, a plurality of first fingers made of a first metal and directly contacting the thin film to form an electron selective layer, and a plurality of second fingers made of a second metal and directly contacting the thin film to form a hole selective layer. The plurality of first fingers and the plurality of second fingers are interdigitated. Each of the plurality of first fingers forms a gap with each of its one or more nearest-neighbor fingers of the plurality of second fingers. In some of these embodiments, the gap is no greater than five times a diffusion length of carriers in the TMDC. The thin film may be a monolayer or multilayer. The TMDC may be $MoS_2$, $MoTe_2$, $WSe_2$, $MoSe_2$, or $WS_2$. The thin film may be grown via CVD. The thin film may have an area of 0.25 $cm^2$ or more.

The present embodiments also includes methods for fabricating any of the optoelectronic devices disclosed herein. For example, a method for fabricating an optoelectronic device includes growing a thin film of a TMDC, transferring the thin film onto a substrate, and depositing first and second electrodes onto the substrate, the thin film, or both. The TMDC may be a monolayer or multilayer. The TMDC may be $MoS_2$, $MoTe_2$, $WSe_2$, $MoSe_2$, or $WS_2$. In one embodiment, said fabricating includes fabricating via CVD. The thin film may have an area of 0.25 $cm^2$ or more. In some embodiments, the first metal is molybdenum, titanium, aluminum, tantalum, scandium, or yttrium and the second metal is platinum, nickel, palladium, gold, or cobalt. In other embodiments, the first electrode includes a plurality of first fingers and the second electrode includes a plurality of second fingers that are interdigitated with the plurality of first fingers.

DETAILED DESCRIPTION

Figure 1A:
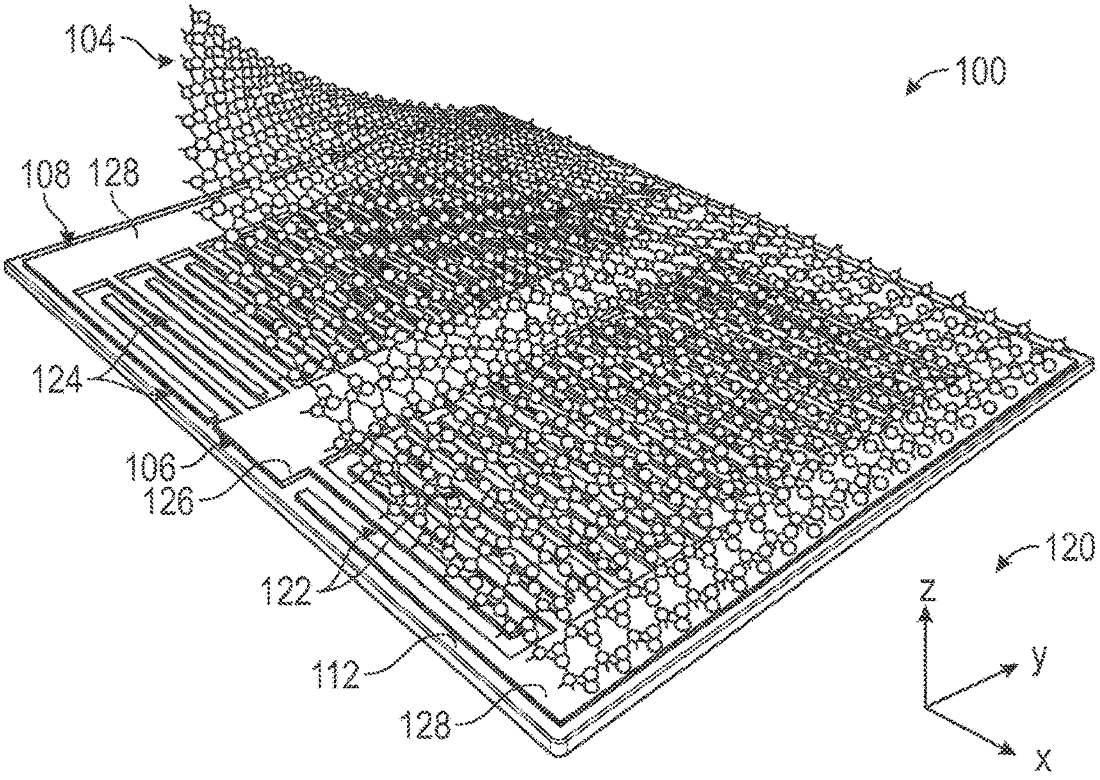
FIG. 1A shows an optoelectronic device 100, in embodiments.

FIG. 1A shows an optoelectronic device 100 that includes a thin film 104 of a transition-metal dichalcogenide (TMDC), a first electrode 106 made of a first metal directly contacting the thin film 104, and a second electrode 108 made of a second metal directly contacting the thin film 104. The optoelectronic device 100 may be fabricated on a substrate 112 that supports the thin film 104, the first electrode 106, the second electrode 108, or any combination thereof. The optoelectronic device 100 may be configured as a photovoltaic cell, photodetector, transistor, photoemitter, or other type of optoelectronic device. For clarity in FIG. 1A, a portion of the thin film 104 is "lifted" to show the geometrical structure of the electrodes 106 and 108. The electrodes 106 and 108 are also referred to herein as contacts.

In some embodiments, the thin film 104 is a monolayer of molybdenum disulfide ($MoS_2$). However, the thin film 104 may alternatively be a different type of TMDC (e.g., $MoSe_2$, $MoTe_2$, $WS_2$, $WSe_2$, $WTe_2$, etc.). Alternatively, the thin film 104 may be multilayer. Accordingly, the thin film 104 is not limited to being only a monolayer of $MoS_2$. The thin film 104 may be grown via chemical vapor deposition (CVD), molecular-beam epitaxy, atomic layer deposition, electrochemical deposition, or another type of thin-film fabrication technique known in the art. The thin film 104 may alternatively be an exfoliated flake. In some embodiments, the thin film 104 has an area of 0.25 $cm^2$ or more.

The electrodes 106 and 108 are asymmetric in that they are made from different types of metal. The different work functions of these metals allows for separation of photo-excited electrons and holes that are generated when the thin film 104 absorbs light. Specifically, the first metal, upon contact with the thin film 104, induces band banding in the TMDC to create an electron selective layer. Electrons in the conduction band of the TMDC can flow through the electron selective layer to enter the first electrode. However, the electron selective layer blocks holes from flowing into the first electrode. Conversely, the second metal, upon contact with the thin film 104, induces opposite band banding in the TMDC to create a hole selective in layer. Holes in the TMDC can flow through the hole selective layer to enter the second electrode. However, the hole selective layer blocks electrons from flowing into the second electrode. For clarity, the electron selective layer is also referred to as an "electron collector" while the hole selective layer is also referred to as a "hole collector."

Whether a metal in contact with the TMDC forms an electron selective layer or hole selective layer depends on the relationship between the work function of the metal and the work function of the TMDC. For an n-type semiconductor like $MoS_2$, a rectifying Schottky barrier is formed when the metal has a work function greater than that of the semiconductor. In this case, the Schottky barrier blocks the flow of electrons from the semiconductor into the metal while allowing holes to flow across this barrier. Accordingly, the Schottky barrier is a hole selective layer. For a p-type semiconductor, this hole selective layer is formed when the metal has a work function less than that of the semiconductor.

For an n-type semiconductor, a non-rectifying ohmic contact is formed when the metal has a work function less than that of the semiconductor. In this case, electrons can flow across the ohmic contact in both directions. However, the ohmic contact presents a barrier for holes, much like how a Schottky barrier is a barrier for electrons. Accordingly, the ohmic contact forms an electron selective layer. For a p-type semiconductor, this electron selective layer is formed when the metal has a work function greater than that of the semiconductor.

The heights of the Schottky and hole barriers formed by the metal contacts depend on the work function of the TMDC, which in turn depends on the type of TMDC. Furthermore, the work function of a TMDC can be altered by doping. In the above example, where $MoS_2$ is intrinsically n-type, the first metal forms the electron selective layer and the second metal forms the hole selective layer. Another TMDC that is intrinsically n-type in $WTe_2$. However, for a TMDC that is p-type, the roles of the metals are reversed: the first metal forms the hole selective layer and the second metal forms the electron selective layer.

As semiconductors, TMDCs can be made explicitly n-type or p-type via doping. This includes TMDCs that are intrinsically n-type or ambipolar. Examples of ambipolar TMDCs include $MoSe_2$, $MoTe_2$, $WS_2$, and $WSe_2$. Accordingly, the thin film 104 may be doped to change its Fermi level, and therefore its work function. For example, the thin film 104 may be grown with dopants or doped after growth via diffusion or ion implantation.

Figure 2:
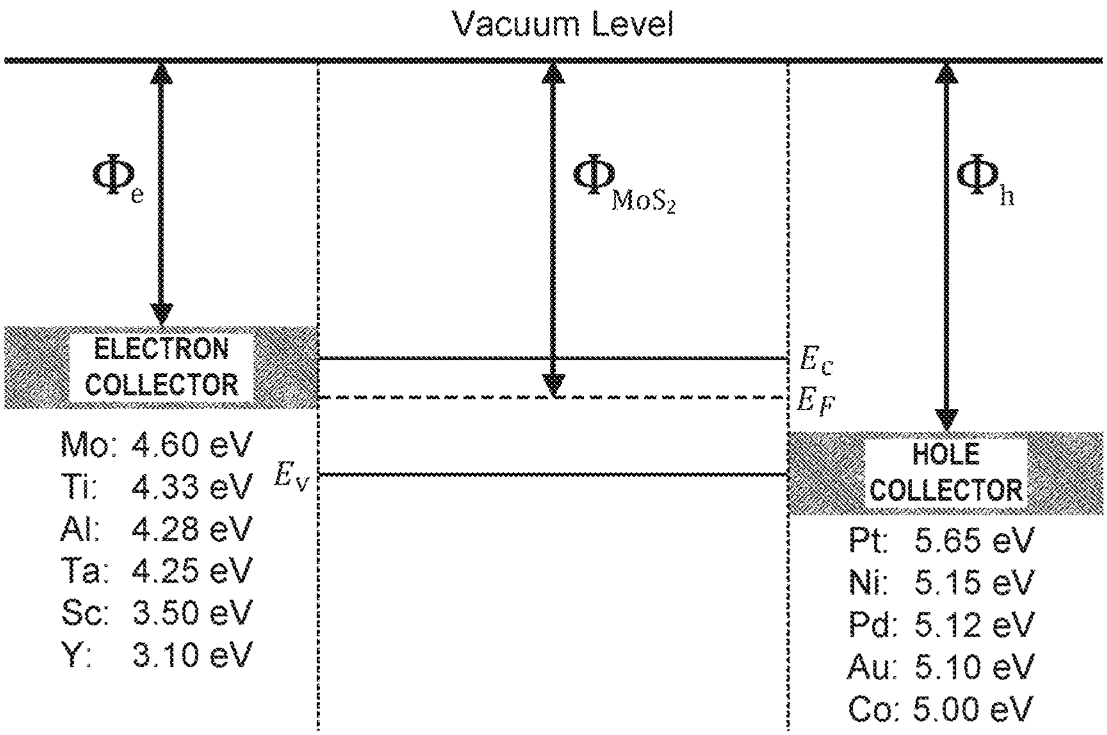
FIG. 2 is a band diagram of the optoelectronic device of FIG. 1A for the case of $MoS_2$.

In some embodiments, the first metal is selected from a first metal set that includes molybdenum, titanium, aluminum, tantalum, scandium, yttrium, or a combination thereof. As shown in FIG. 2, the metals in the first metal set have similar work functions and therefore will form an electron selective layer with the TMDC when the TMDC is n-type. Alternatively, these metals will form a hole selective layer when the TMDC is p-type.

In some embodiments, the second metal is selected from a second metal set that includes platinum, nickel, palladium, gold, cobalt, or a combination thereof. These metals have similar work functions. Furthermore, the work functions of the metals of the second set are greater than those of the first set. Accordingly, the second metal will form a hole selective layer with the TMDC when the TMDC is n-type. Alternatively, the second metal will form an electron selective layer when the TMDC is p-type.

In the example of FIG. 1A, the first electrode 106 forms a plurality of first fingers 122 that extend parallel to the x axis of a right-handed coordinate system 120. The first fingers 122 are electrically connected to a first busbar 126 that lies parallel to the y axis. The first fingers 122 and first busbar 126 are part of the first electrode 106 and are therefore made from the first metal. Similarly, the second electrode 108 forms a plurality of second fingers 124 that also extend parallel to the x axis. The second fingers 124 are electrically connected to a second busbar 128 that has three linear segments shaped as a "C." The second fingers 124 and second busbar 128 are part of the second electrode 108 and are therefore made from the second metal. Each of the fingers 122 and 124 is shown in FIG. 1A has a finger width along y and a finger length along x. Neighboring fingers are separated along y by an insulating gap. The size of the gap is also referred to herein as the "channel length." The geometry of the first fingers 122, second fingers 124, first busbar 126, and second busbar 128 may be different than shown in FIG. 1A without departing from the scope hereof.

In some embodiments, the first fingers 122 and second fingers 124 are interdigitated, as shown in FIG. 1A. Specifically, one or two of the second fingers 124 are nearest neighbors to each of the first fingers 122. Similarly, one or two of the first fingers 122 are nearest neighbors to each of the second fingers 124. Thus, when moving along y, the first fingers 122 and second fingers 124 form an alternating sequence.

The thin film 104 has a first face that faces upward (i.e., in the +z direction) and a second face, opposite to the first face, that faces downward (i.e., in the −z direction). In FIG. 1A, all of the fingers 122 and 124 directly contact the second face. In this case, the fingers 122 and 124 are at least partially located between the substrate 112 and the thin film 104. This geometry is advantageous when the thin film 104 is illuminated from above (i.e., the +z direction) as none of the fingers 122 and 124 block the thin film 104. Alternatively, the first fingers 122 and second fingers 124 may be located on the first face, in which case the substrate 112 supports the thin film 104 and the thin film 104 supports the fingers 122 and 124 such that the thin film 104 is at least partially located between the substrate 112 and the fingers 122 and 124. In other embodiments, the fingers 122 and 124 contact both the first and second faces of the thin film 104. For example, the first fingers 122 may contact the first face while the second fingers 124 the second face, or vice versa.

Figure 1B:
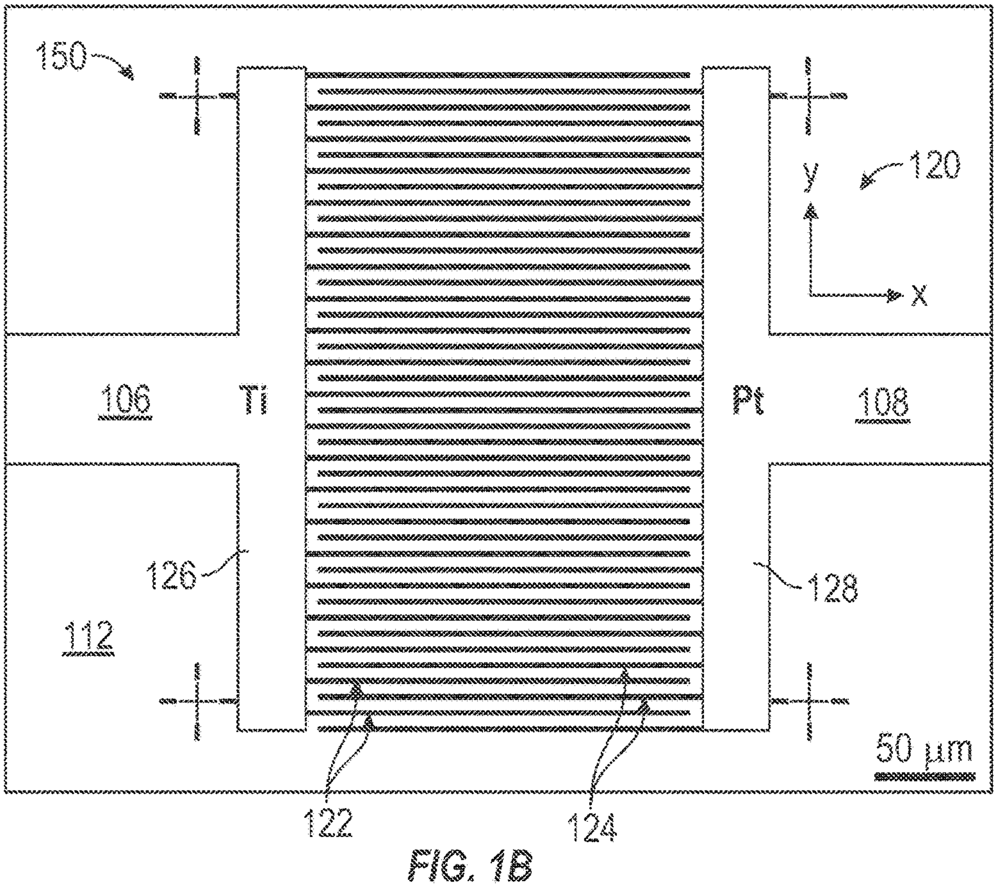
FIG. 1B is an image of a Schottky-junction solar cell that was fabricated with asymmetric first and second electrodes.

FIG. 1B is an image of a Schottky-junction solar cell 150 that was fabricated with asymmetric first and second electrodes. The solar cell 150 is one example of the optoelectronic device 100 of FIG. 1A. The first electrode 106 of the solar cell 150 is a layer of titanium (Ti) while the second electrode 108 is a layer of platinum (Pt). Each of these layers has a thickness of 50 nm. The substrate 112 is silicon dioxide ($SiO_2$) on silicon (Si). However, the substrate 112 may alternatively be glass, sapphire, polyimide, or another substrate material used for optoelectronic devices.

To fabricate the solar cell 150, the substrate 112 was patterned using electron beam lithography followed by deposition of the first metal and a liftoff step. The interdigitated fingers 122 and 124 were produced by precise alignment of a second electron beam lithography pattern and a second metal deposition and liftoff. Monolayer $MoS_2$ was grown on a sapphire substrate using tube-furnace CVD with $MoO_3$ and $S_2$ powder precursors, exhibiting precise monolayer thickness control and uniformity over large area (>1 $cm^2$). As-grown films were characterized for physical and optoelectronic properties, such as thickness via atomic force microscopy, photoluminescence, Raman spectroscopy, and carrier mobility. The measured mobility of the films used in this work was 1-3 $cm^2\ V^{-1}\ s^{-1}$. To complete the fabrication of the solar cell 150, one of these $MoS_2$ monolayers was transferred onto the metal contacts. Due to its thinness, the thin film 104 is not visible in FIG. 1B.

The interdigitated fingers 122 and 124 of the solar cell 150 span an active area of 300×500 μm. The fingers 122 and 124 have a finger width of 2 μm and are separated by a channel length, or gap, of 10 μm. However, devices with other channel lengths were fabricated, as discussed below. Unless otherwise stated, the performance of the 1-μm channel length devices are presented and analyzed throughout the present disclosure. Devices were fabricated in arrays to generate a greater number of measurable devices for the same $MoS_2$ film, enabling measurements with statistical significance.

FIG. 2 is a band diagram of the optoelectronic device 100 of FIG. 1A for the case of $MoS_2$. As indicated in FIG. 2, metals with various work functions were studied. The low work-function metals Mo, Ti, AL, Ta, Sc, and Y were considered for electron collection while the high work-function metals Co, Ni, Au, Pd, and Pt were considered for hole collection. Herein, a work function of an electron-collecting metal is denoted $\Phi_e$ while a work function for a hole-collecting metal is denoted $\Phi_h$. The middle of FIG. 2 shows the band structure of monolayer $MoS_2$, which has a bandgap of 1.85 eV.

Optoelectronic Device Model

A one-dimensional (1D) finite element analysis model was built the COMSOL Multiphysics simulation tool's Semiconductor Module. This model simulates a $MoS_2$-based solar cell device with asymmetric Ti and Pt contacts. The model uses homogenous doping in the active $MoS_2$ material via the Analytical Doping Model built in to COMSOL. Eqn. 1 was used to calculate photogeneration that includes the AM1.5G solar irradiance and $MoS_2$ absorption spectra. The absorption spectra were calculated in Eqn. 2 by using the extinction coefficient of monolayer $MoS_2$. The complex refractive index for monolayer $MoS_2$ was measured. Eqn. 3 shows the photon flux that is used to calculate the photogeneration.

$$G = \int_0^\infty \alpha(\lambda)\varphi(\lambda)e^{-\alpha(\lambda)z}d\lambda \tag{1}$$

$$\alpha(\lambda) = \frac{4\pi}{\lambda}\kappa(\lambda) \tag{2}$$

$$\varphi(\lambda) = \frac{\lambda}{hc}F(\lambda) \tag{3}$$

Here, z is the depth into the device while the lateral junction is formed in the x-y plane between the contacts; given the monolayer thickness of the device, the generation profile is constant in z. The wavelength in vacuum is denoted 1, the wavelength-dependent extinction coefficient is denoted $\kappa(\lambda)$, and the AM1.5G spectral irradiance is denoted $F(\lambda)$. With 100% IQE (i.e., all the electron-hole pairs that are generated are collected), a maximum $J_{sc}$ of 1.34 mA/cm$^2$ was estimated for monolayer $MoS_2$-based solar cells. To account for realistic collection losses, the Shockley-Read-Hall recombination model was implemented with a Trap-Assisted Recombination feature, also built in to the COMSOL solver.

The model used several non-parameterized inputs for the $MoS_2$ layer, including a thickness of 0.65 nm, a doping concentration of $1\times10^{12}$ cm$^{-2}$, a bandgap of $E_g$=1.85 eV, an electron affinity of $\chi_{MoS_2}$=4.5 eV, a relative permittivity of 3.5, and an effective density of states of $2.66\times10^{19}$ cm$^{-3}$ for electrons and $2.86\times10^{19}$ cm$^{-3}$ for holes. Some other inputs into the model were parameterized and swept for realistic values that are obtained from either our experiments or literature, such as an electron mobility between 1 and 10 cm$^2$ V$^{-1}$ s$^{-1}$ (extracted experimentally from a $MoS_2$-based transistor using the FET model) and a carrier lifetime of 1 μs, calculated from our experimentally measured diffusion length and mobility. The work functions of the asymmetric metal contacts were also parameterized, and their effect on the overall device performance was studied.

Figure 3:
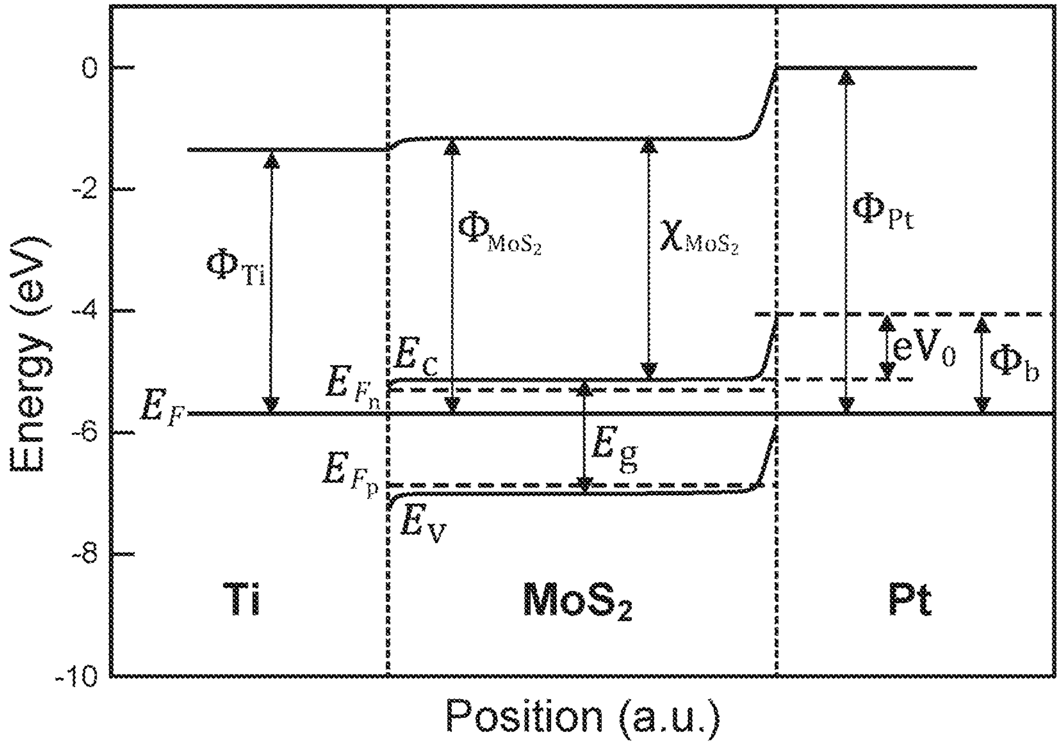
FIG. 3 shows the band structure of a Ti—$MoS_2$—Pt Schottky-junction solar cell showing the asymmetric band bending at the metal-semiconductor interfaces.

FIG. 3 is a band diagram showing the energy structure of the model. The band bending between the $MoS_2$ and contact metals is visible. The left side of the band diagram is the Ti contact, whose work function $\Phi_{Ti}$=4.33 eV aligns well with the conduction band of $MoS_2$; hence an approximately ohmic contact forms at this metal-semiconductor junction. The right side of the band diagram is the Pt contact, whose work function $\Phi_{Pt}$=5.65 eV forms a large Schottky barrier that is evident by the large band-bending. Also in FIG. 3, the work function of the monolayer $MoS_2$ is $\Phi_{MoS_2}$=4.72 eV, the Schottky barrier height is $\Phi_b$=1.55 eV, and $eV_0$=0.98 eV.

Figure 4A:
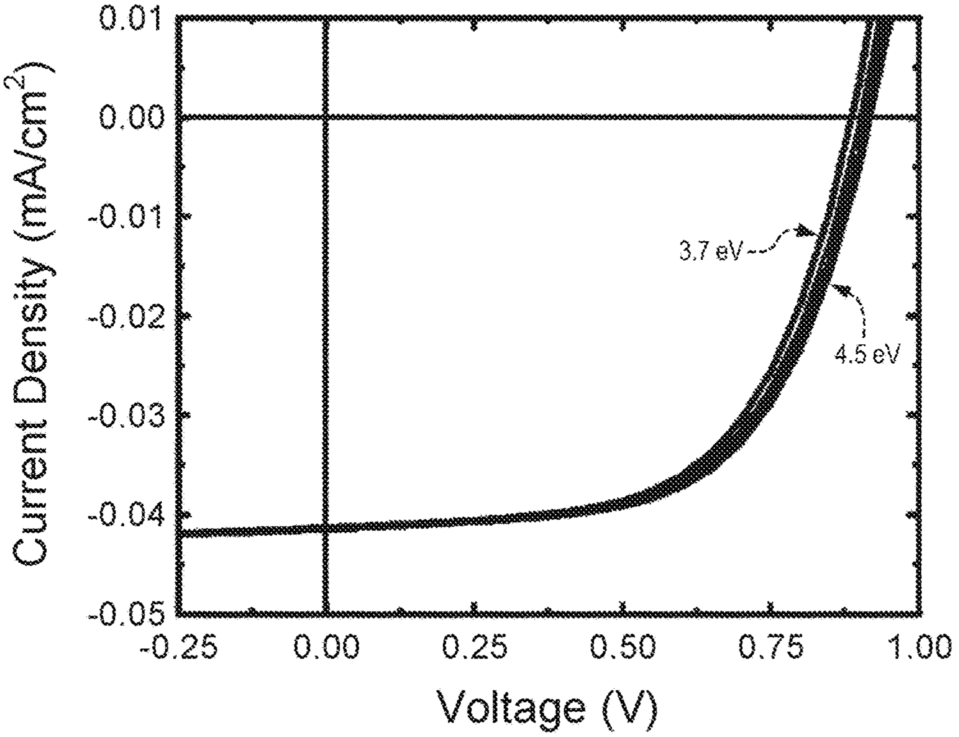
FIGS. 4A and 4B show simulated J-V plots of a Schottky-junction monolayer $MoS_2$-based solar cell with the effects of contact metal work functions for the electron-selective contact $\Phi_e$ and the hole-selective contact $\Phi_h$, respectively.
Figure 4B:
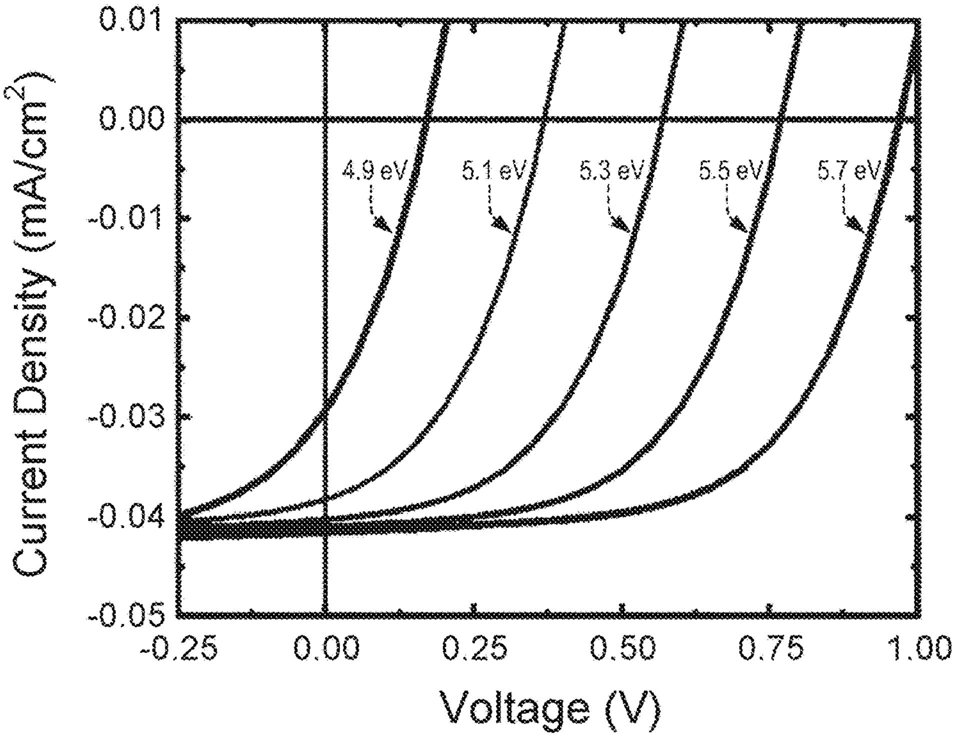

Once the model was established, the current-density-voltage (J-V) relationship was studied under forward bias. FIGS. 4A and 4B show the simulated J-V plots for the various work functions of the asymmetric contacts. In FIG. 4A, electron-collector work functions $\Phi_e$ of 3.7, 3.9, 4.1, 4.3, and 4.5 eV are plotted assuming a hole-collector work function $\Phi_h$ of 5.65 eV. As can be seen, the open-circuit voltage $V_{oc}$ does not depend much on $\Phi_e$. In FIG. 4B, hole-collector work functions $\Phi_h$ of 4.9, 5.1, 5.3, 5.5, and 5.7 eV are plotted for an electron-collector work function of 4.33 eV. Here, the open-circuit voltage $V_{oc}$ depends significantly on $\Phi_h$.

Experimental Photovoltaic Performance

Titanium and platinum were chosen as the contact metals because of their low (4.33 eV) and high (5.65 eV) work functions, respectively, which are suitable for Schottky-barrier and hole-barrier formation, as discussed in the previous sections, along with their wide use to-date for contacting 2D $MoS_2$. These asymmetric contacts created the necessary band offsets at the metal-$MoS_2$ interface between the Fermi levels of these metals and that of $MoS_2$, thus driving the electrons toward Ti and holes toward Pt and separating the photogenerated carriers without any applied bias.

Devices were characterized for open-circuit voltage $V_{oc}$, short-circuit current $I_{sc}$, short-circuit current density $J_{sc}$, fill factor FF, power conversion efficiency n, series resistance $R_s$, shunt resistance $R_{sh}$, and specific power, all at room temperature. The devices were illuminated by monochromatic laser excitation with high concentration and the standard one-sun AM1.5D spectrum in a solar simulator.

Figure 5:
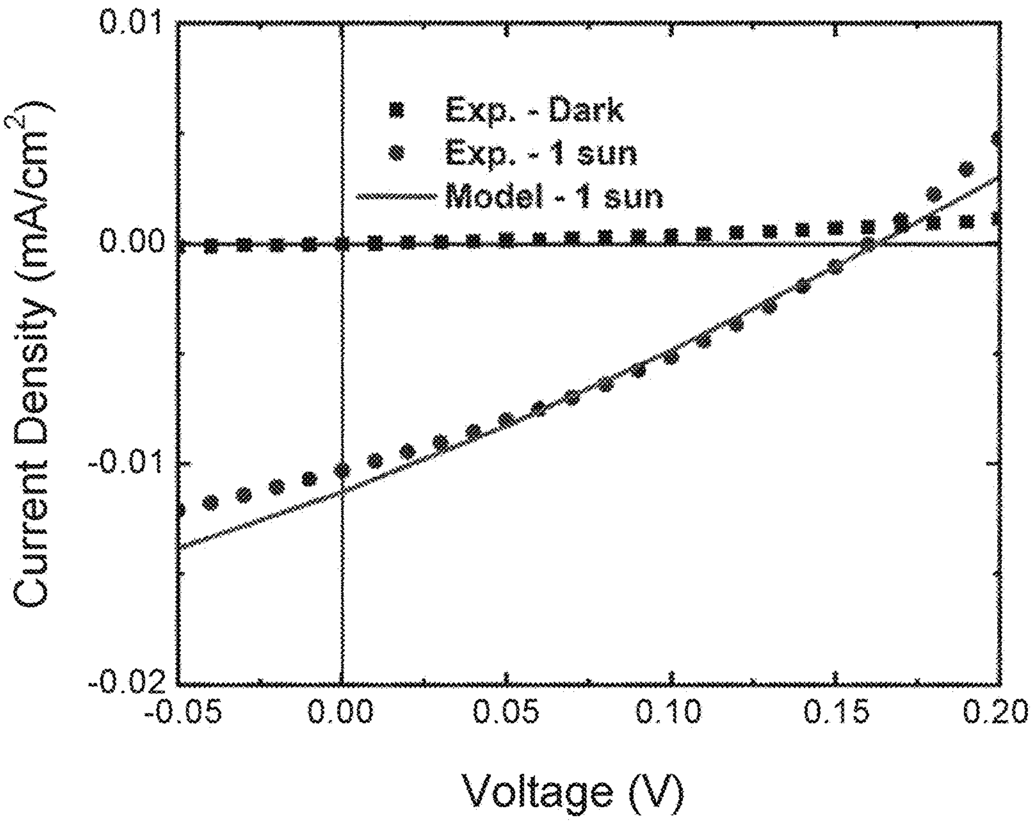
FIG. 5 shows performance of a Schottky-junction monolayer $MoS_2$-based solar cell in dark and under 1-sun equivalent AM1.5D illumination.

FIG. 5 shows the PV performance under dark (squares) and standard 1-sun AM1.5D (circles) illumination conditions. As shown, $V_{oc}$ and $J_{sc}$ were recorded as 160 mV and 0.01 mA/cm$^2$, respectively. The fill factor FF was calculated to be 31% and the efficiency of the device was $\eta$=0.0005%. The extracted series resistance was $R_s$=$8.9\times10^3$ Ω·cm$^2$ and the shunt resistance was $R_{sh}$=$2.6\times10^4$ Ω·cm$^2$, calculated from the slope of the J-V curve at the open-circuit and short-circuit conditions, respectively. The data in FIG. 5 was measured at room temperature. The solar cell active area was 0.15 mm$^2$ with 1 μm channels between asymmetric Ti and Pt contacts. The solid line is a modeled J-V plot for the same solar cell structure.

The series and shunt resistance are both high relative to other 2D PV devices due to the lateral transport device architecture used in this work. This tradeoff, achieving a desirable shunt resistance at the expense of a less desirable series resistance, was made to avoid pinhole shunting from defects in our CVD films. In addition to the large series resistance, several factors limited overall efficiency in these proof-of-concept devices, including relatively low photon absorption in a single monolayer device, hole collector work function reduction, and limited electronic transport due to material quality.

Figure 6A:
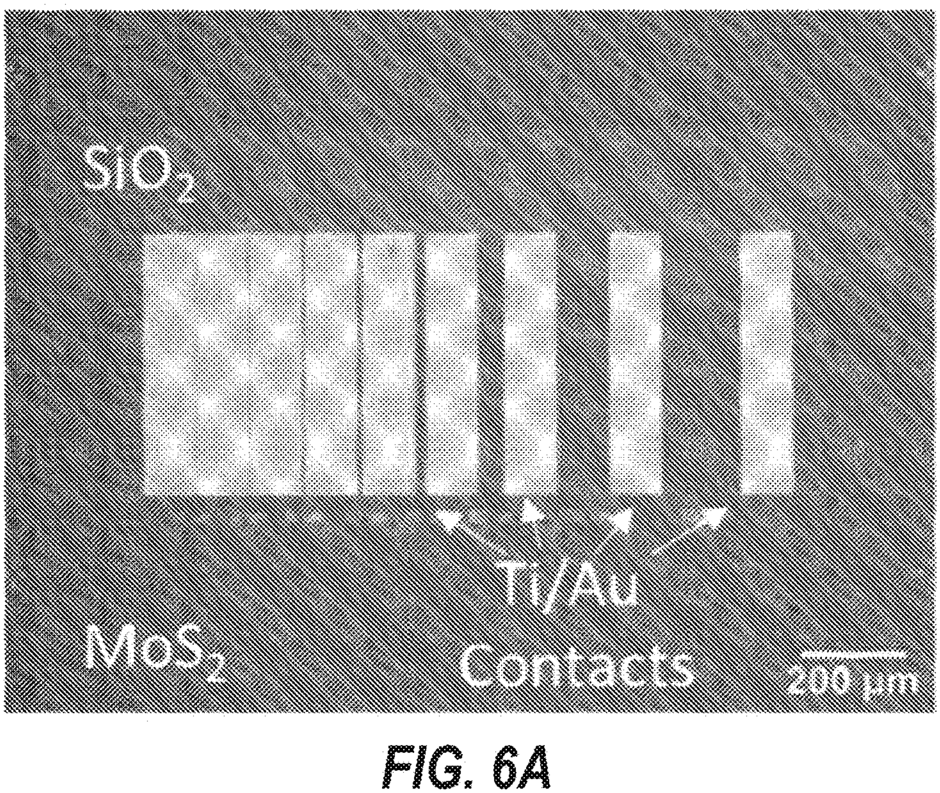
FIG. 6A shows a transfer length method (TLM) grid pattern on monolayer $MoS_2$ with variable channel lengths from 1 μm to 150 μm. These structures were used to extract the contact resistivity at the metal-semiconductor interface and the sheet resistivity of the semiconducting material.

To understand limitations in electronic transport, the solar cell was divided into a resistance network comprising the measurement probes, contacts pads, busbars, grid fingers, contact resistance at the metal-semiconductor interface, and sheet resistance. The total resistance from the probes, contact pads, busbars, and fingers was calculated as 225Ω, showing that the bulk of the series resistance comes from the contact and sheet resistance. To extract these values, the transfer length method (TLM) was used. FIG. 6A shows a TLM grid on monolayer $MoS_2$ with variable channel lengths from 1 μm and 150 μm. These measurements were performed with both Ti/Au contacts and Pt contacts under a 0.5-V bias in dark, room-temperature conditions.

Figure 6B:
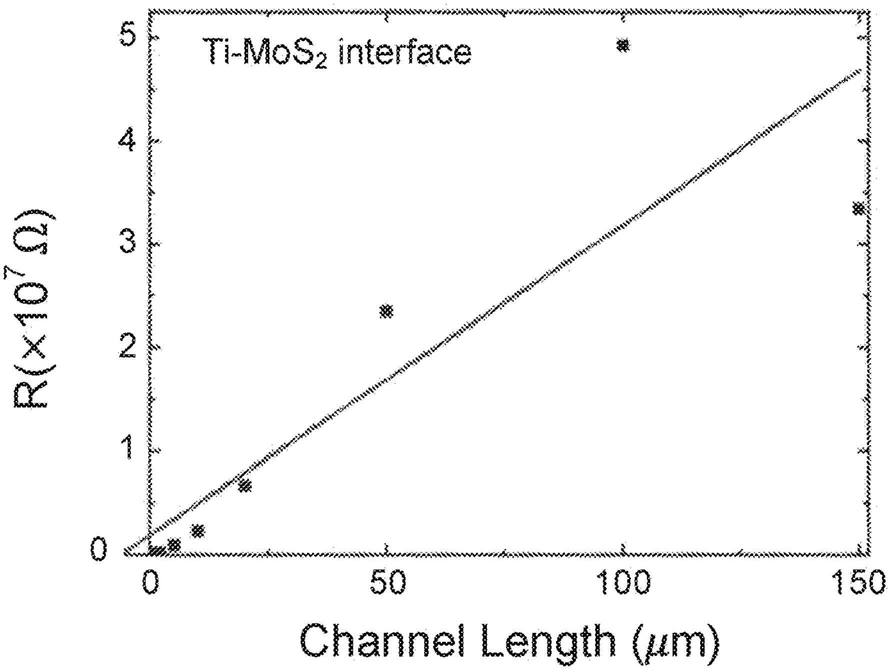
FIGS. 6B and 6C are TLM plots for Ti—$MoS_2$ and Pt—$MoS_2$ devices, respectively. The resistances are plotted for various channel lengths. Contact resistance is extracted from the y-axis intercept of the linear fit (divided by two) and the sheet resistance is calculated by taking the slope of the linear fit line and dividing it by the channel width.
Figure 6C:
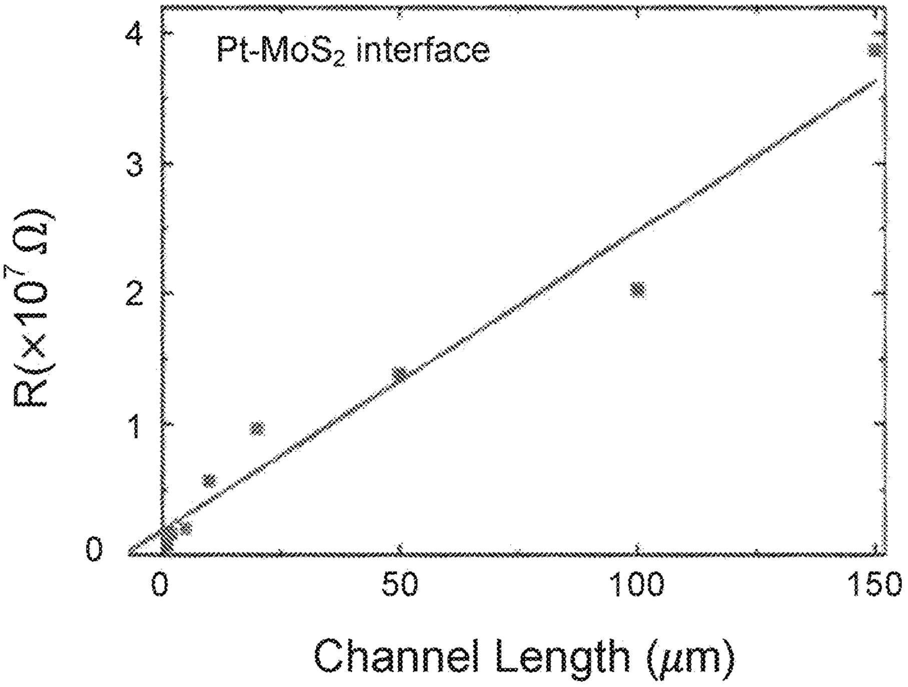

By analyzing the data shown in FIGS. 6A-C, the average contact resistivity of the Pt—$MoS_2$ and Ti—$MoS_2$ interface was calculated to be 45.33 $\Omega\cdot cm^2$ and 17.5 $\Omega\cdot cm^2$, respectively. The average sheet resistance was estimated to be $2.34\times10^8$ Ω/□. The high contact and sheet resistance in these devices contributes significantly to their poor electronic transport performance. In comparison, contact resistivity is typically in the $10^{-6}$ $\Omega\cdot cm^2$ range for a good solar cell. Sheet resistance should be sufficiently low for good lateral transport, preferably in the 50-100Ω/□ range. The high contact resistance measured here is not a concern, as these Schottky devices do not use ohmic contacts by design.

Figure 7A:
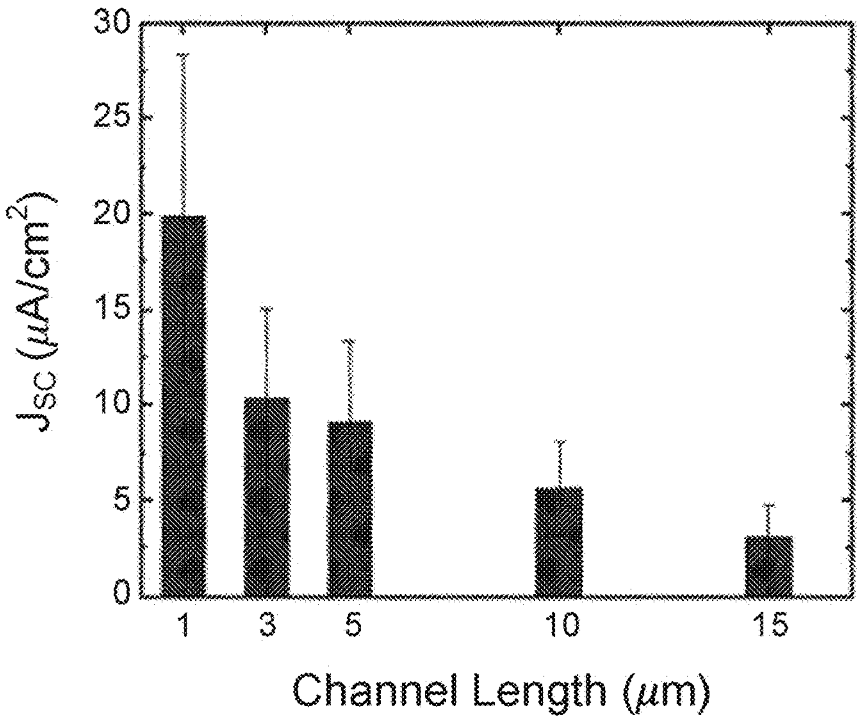
FIGS. 7A-E are plots of the short-circuit current density $J_{sc}$, the open-circuit voltage $V_{oc}$, the fill factor, the efficiency, and the specific power, respectively, versus channel length for seven devices of each channel length under 1-sun equivalent AM1.5D illumination. The open-circuit voltage $V_{oc}$ is an important parameter that gives insight into device quality and performance potential.
Figure 7B:
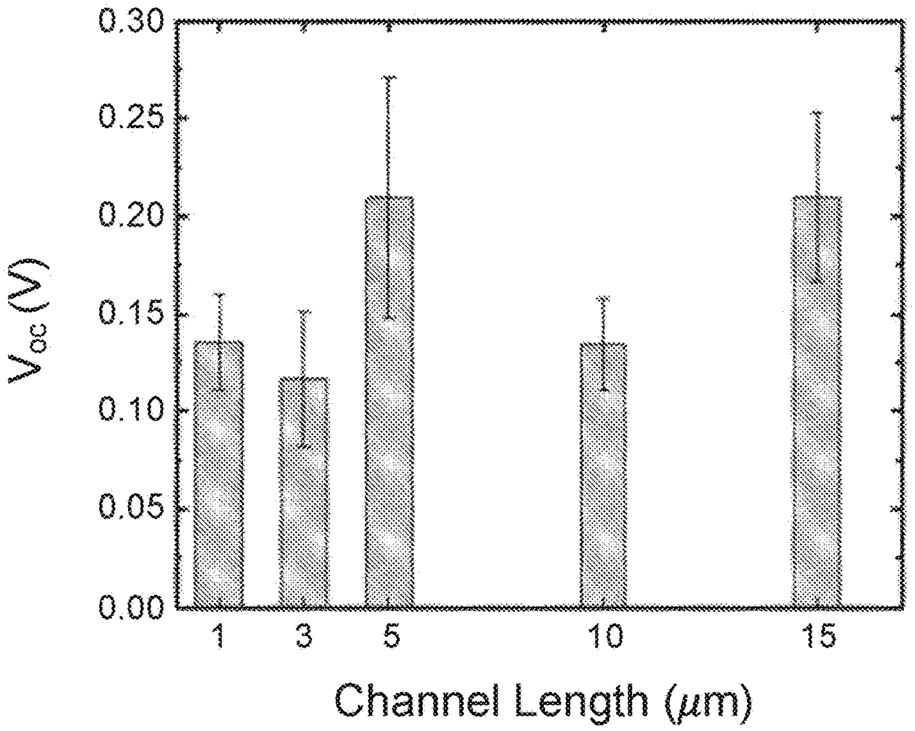
Figure 7C:
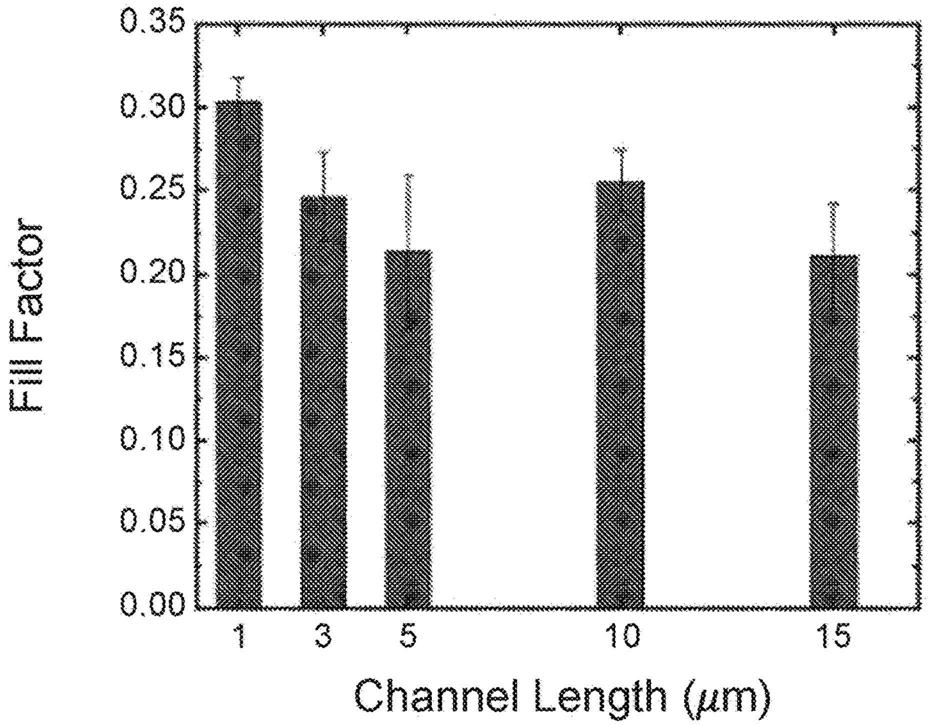
Figure 7D:
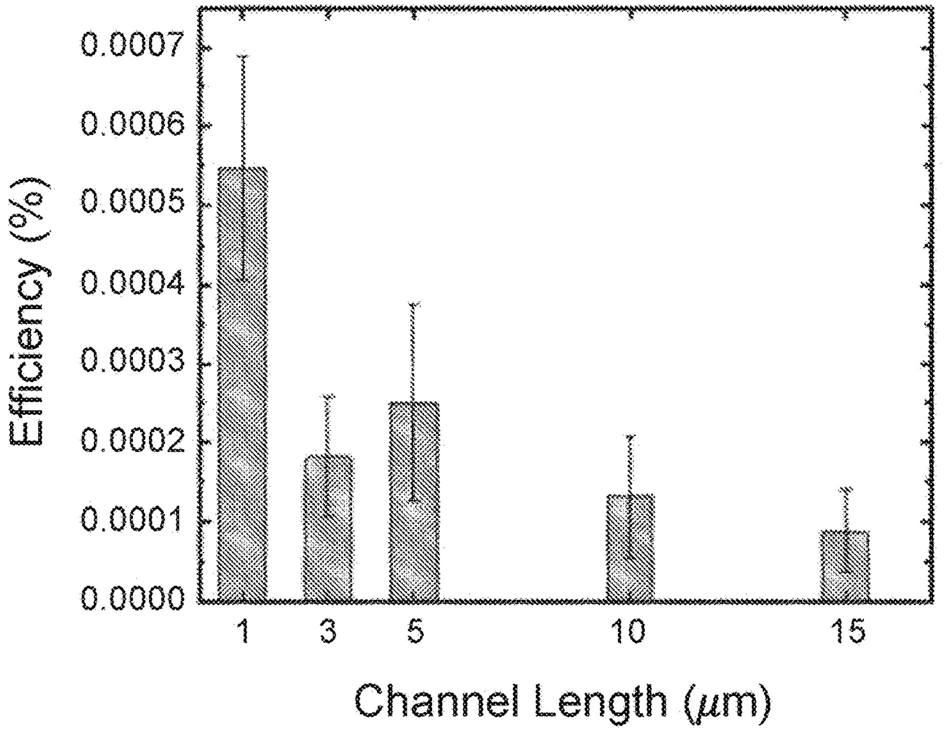
Figure 7E:
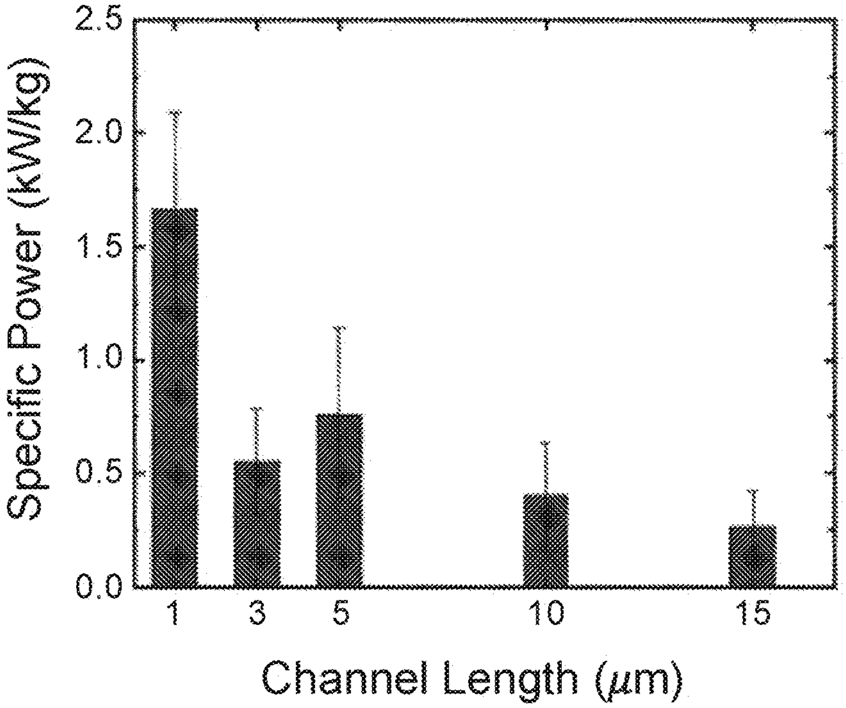

Next, the device performance was investigated with respect to the channel length, or the gap size between neighboring Ti and Pt fingers. Devices were fabricated with channels lengths of 1, 3, 5, 10, and 15 μm. In each case, the total active area of the devices was 0.15 $mm^2$. FIGS. 7A and 7B are plots of the short-circuit current density $J_{sc}$ and the open-circuit voltage $V_{oc}$, respectively, versus channel length for a total of 35 devices. Data from seven devices were included in each column (channel length) for drawing statistical significance.

The short-circuit current density $J_{sc}$ had a clear dependence on channel width, as can be seen in FIG. 7A. As the channel size increased, the devices produced less current under the same illumination conditions and total device active area. This was a result of the short diffusion length of the carriers in the CVD-grown 2D active material. When the channel length became smaller than the diffusion length, a significant majority of the generated carriers could be collected by the contacts before they recombined. In this case, $J_{sc}$ should saturate with decreasing channel length. From the trend in FIG. 7A, the diffusion length was smaller than 3 μm. Spatial mapping of photocurrent in these devices indicated a lateral diffusion length of about 1.0 μm. The open-circuit voltage $V_{oc}$ did not have a clear dependence on channel length under the 1-sun illumination conditions.

Specific power, or power generated per unit mass, is an important metric for PV in weight or volume constrained applications, such as space solar power, building-integrated PV, and vehicle-integrated PV. The cell active material's specific power is a significant part of the overall module/package specific power. Compared to the record state-of-the-art GaAs and Si cells' active material specific powers of 54 and 2.5 kW/kg, respectively, the devices presented here have already achieved a specific power of 1.58 kW/kg before optimization.

Model Projection and Analysis

The semiconductor device physics model discussed above is used to understand these 2D PV device results and informs the design of future devices with significantly enhanced performance. FIG. 5 shows a modeled J-V plot of a similar device structure. To match the modeled J-V relationship to that of the experiment under 1-sun AM1.5D illumination, several parameters are in the model are adjusted. The best fit, as shown in FIG. 5, is a result of the following parameters: $\Phi_e$ as 3.82 eV, $\Phi_h$ as 4.91 eV, carrier mobility of the $MoS_2$ layer as 1 $cm^2\ V^{-1}\ s^{-1}$ (matching our measured values), and lifetime of 1 μs. These work function values signify lower work function than pristine post-sputter metal surfaces but higher work function than that of a sample that has been exposed to ordinary environmental conditions for an extended period. The lower work function of the Pt contact resulted in a significant degradation of the open-circuit voltage $V_{oc}$ in these devices, as shown in FIG. 4B. The best-fit mobility and lifetime results in a diffusion length of 1 μm, which matches the higher $J_{sc}$ shown in FIG. 7A for 1 μm channel lengths and our device photocurrent maps.

Figure 8:
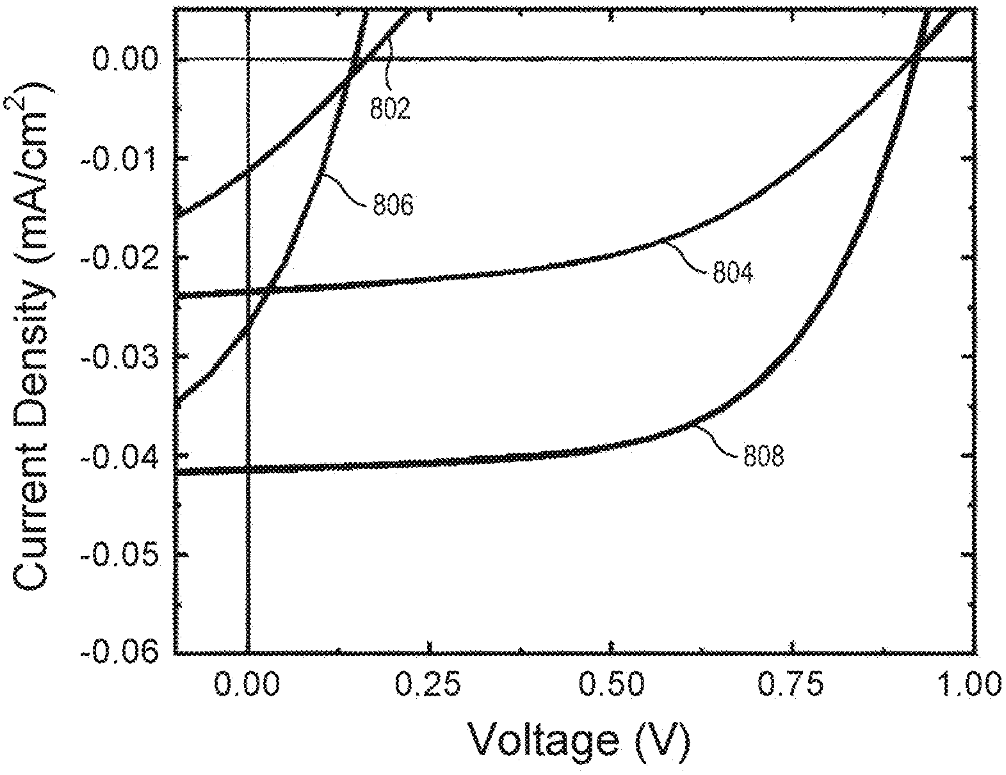
FIG. 8 shows projected performance of an optimized monolayer $MoS_2$-based solar cell with asymmetric Ti—Pt contacts under AM1.5D illumination.

From the experiment-matched model, we systematically swept parameters to optimize the device performance for a monolayer $MoS_2$-based solar cell. These improvements are shown graphically in FIG. 8. As a baseline, the curve 802 is the J-V plot for the base model, matched to experiment. As shown by the curve 804, the highest impact on device performance, especially the open-circuit voltage $V_{oc}$, comes from increasing the hole collector metal's work function to 5.7 eV, i.e., that of pristine Pt. The curve 806 shows the effect of increasing mobility to 10 $cm^2\ V^{-1}\ s^{-1}$, i.e., that of higher performing CVD-grown 2D $MoS_2$. Finally, the curve 808 is the projected J-V plot for the optimized parameters of $\Phi_e$=4.33 eV, $\Phi_h$=5.65 eV, a carrier mobility of 10 $cm^2\ V^{-1}\ s^{-1}$, and a lifetime of 1 μs. The model predicts an open-circuit voltage $V_{oc}$ of 0.92 V and a short-circuit current density $J_{sc}$ of 0.4 $mA/cm^2$ with a single 0.65-nm-thick active $MoS_2$ absorber layer. The fill factor is 60.4%. Although the power conversion efficiency is only 0.02%, the specific power of 69.9 kW/kg is higher than that of record-setting III-V solar cells. In another embodiment, the short-circuit current $J_{sc}$ and efficiency of are improved dramatically by stacking monolayers for enhanced photon absorption.

As has been shown, contact engineering has an impact on the performance of these Schottky PV devices, and with optimized contacts, the open-circuit voltage $V_{oc}$ and short-circuit current density $J_{sc}$ of these solar cells can be improved substantially. Precise knowledge of the work function of a metal is important for design, as it allows us to model the devices accurately. Our initial experiments with improving work functions of as-evaporated metals showed promising results. We measured the work functions of as-deposited Ti and Pt as 3.77 eV and 4.90 eV, respectively. By sputtering the metal films in vacuum followed by in-situ work function measurements, the same Ti and Pt films showed work functions of 4.19 eV and 5.35 eV, respectively.

In other embodiments, the present disclosure includes other options for improving 2D PV device design and fabrication. There are alternative 2D semiconducting materials with lower bandgaps that may be more suitable for PV device design than $MoS_2$ (~1.8 eV), such as $MoTe_2$ (~1.1 eV), $WSe_2$ (~1.4 eV), etc. It has been shown that 2D TMDCs can absorb nearly 100% of broadband visible light with sub-15 nm thickness. The absorption profile can be improved by stacking multiple monolayers on top of each other. Our initial studies showed that stacked monolayers of CVD-grown $MoS_2$ behaved as independent layers with a linear increase in absorption with additional layers, rather than behaving as bilayers or trilayers with reduced absorption per layer.

Enhanced Absorption by Stacking Monolayers

Figure 10A:
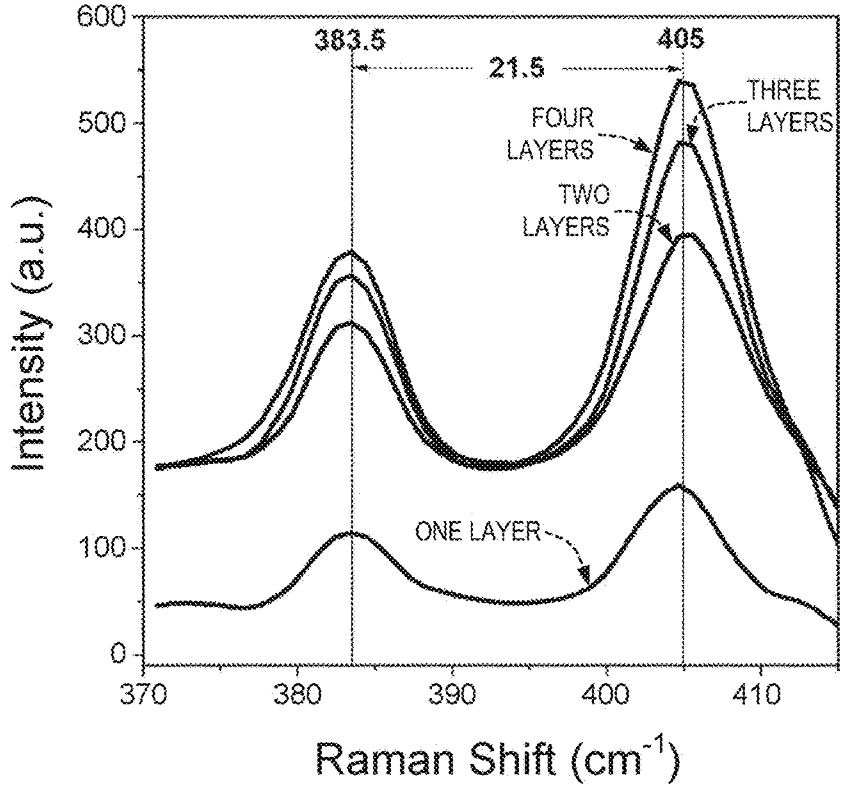
FIGS. 10A and 10B show Raman and absorption measurements, respectively, in $MoS_2$ monolayers from a single monolayer to four stacked monolayers.
Figure 10B:
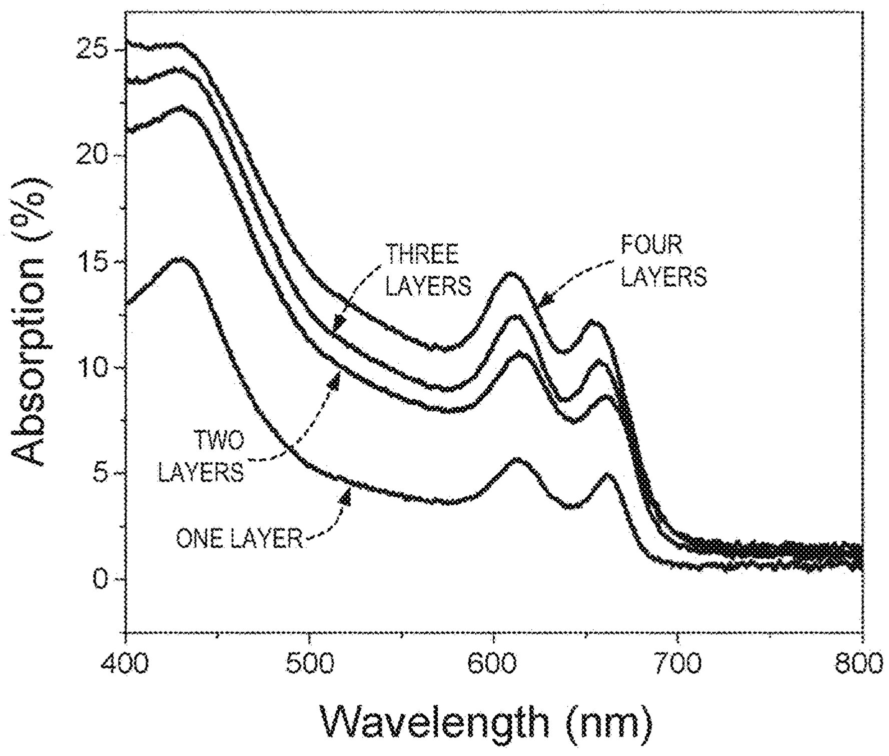
Figure 10C:
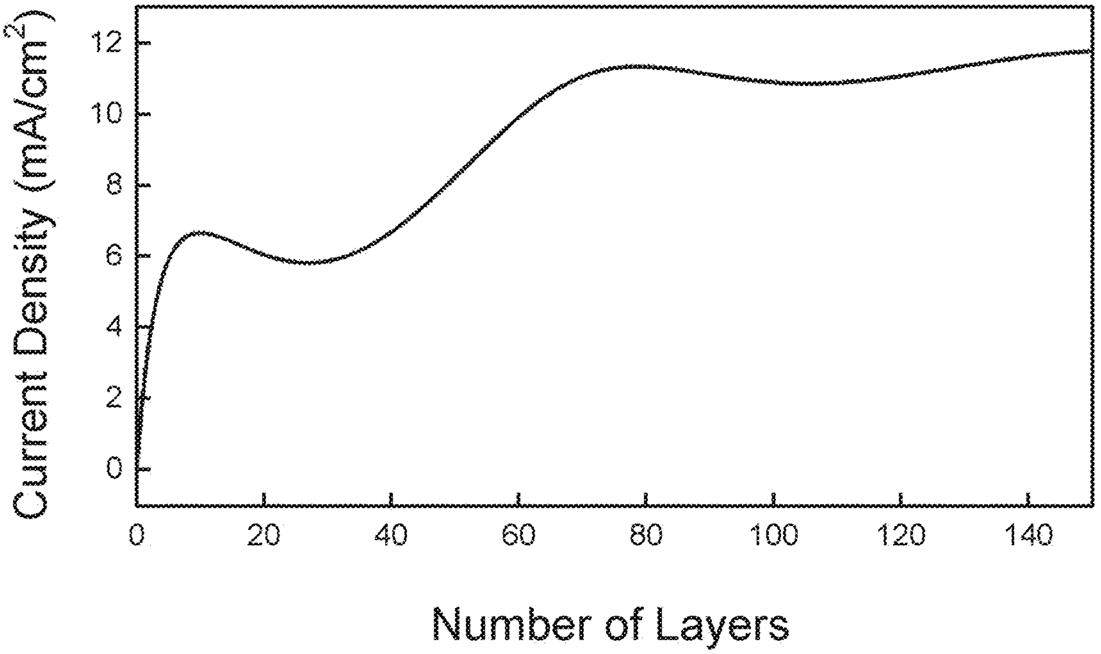
FIG. 10C is a plot of current density versus the number of stacked monolayers.

Stacked-monolayer $MoS_2$ exhibit enhanced absorption as compared to directly synthesized bulk $MoS_2$ with the same number of layers. FIG. 10A shows Raman measurements of samples with 1, 2, 3 and 4 monolayers stacked. The Raman data shows that the stacked monolayers' Raman $A^1_g$ and $E^1_{2g}$ vibrational modes have a peak difference of 21.5 $cm^{-1}$, consistent with the single monolayer, indicating that there was no monolayer-to-bulk transition from the sequential stacking of the monolayer $MoS_2$ films. The absorption of monolayer and few-monolayer films were then studied experimentally by incrementally stacking the CVD grown monolayers and measuring the absorption after each layer transfer using a Perkin Elmer LAMBDA 750 UV/Vis/NIR Spectrophotometer. The results are shown in FIG. 10B. The relative absorption increased with each layer and the enhancement in absorption points to an expected increase in photogenerated current in the $MoS_2$ active layer of the Schottky PV device. From the modeled results, we achieved maximum absorption for AM0 by stacking up to 140 $MoS_2$ monolayers. This led to an increase in $J_{sc}$ shown in FIG. 10C and an increase in efficiency of the 2D material based solar cell. The cell thickness was optimized to 52 nm (or 80 layers) to make the fabrication of the cell easier, and to maximize the specific power.

In other embodiments, the optical absorption is further enhanced by applying optical coatings to the front, or a back reflector can also be used as the back contact for vertical solar cells. Effective light trapping mechanisms may be integrated into the device structures, including nanostructures for enhanced photon capture. Dielectric encapsulation and passivating surface treatments such as the dichloroethane (DCE) treatment can significantly improve the carrier transport and thus the overall performance of a 2D PV device.

While most discussions thus far have revolved around lateral transport 2D PV, vertical Schottky-junction 2D PV could be a suitable alternative to p-n junctions. With vertical Schottky junctions, the devices would not be affected by low lateral transport and high sheet resistance. Instead, the generated carriers will have to diffuse through nanometer thick films, unlocking the 2D films' true potential.

In other embodiments, TMDCs are effectively doped to be both n-type and p-type, allowing for fabrication of a homojunction PV device. Another path forward is to make heterojunction devices, such as $WSe_2/MoS_2$ or $WSe_2/MoSe_2$ heterojunctions.

In other embodiments, the approaches of the present disclosure are transferred on to transparent and flexible substrates. Two-dimensional materials that are only angstroms thick and absorb 5-20% of the incoming light can revolutionize the way PVs are made today. Such semi-transparent and/or flexible devices can have widespread applications where optical throughput or high bend radius are beneficial. Also, as demonstrated by the potential for high specific power, 2D PV that are synthesized on or transferred to ultra-thin support films, such as polyimide or other materials used in solar sails, are an excellent candidate for any weight or space constrained PV applications, especially those in space.

Large-Area Devices

Figure 9A:
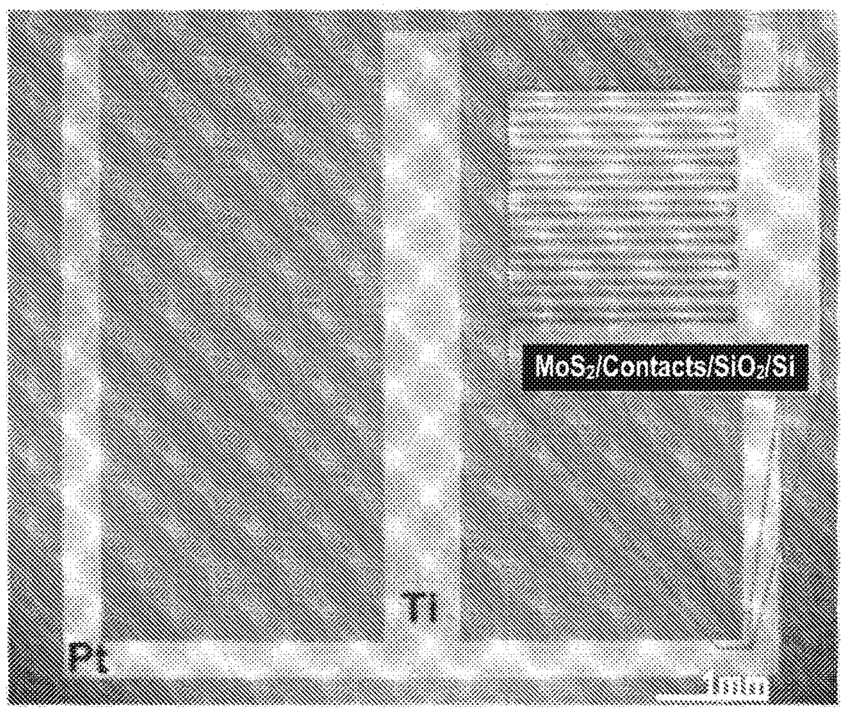
FIG. 9A is an optical micrograph of a large-area (25 $mm^2$) PV device with monolayer $MoS_2$ (0.65 nm thick).

To further demonstrate the scalability of the 2D PV devices described herein, we fabricated PV devices with monolayer $MoS_2$ that are 5×5 mm in size—a standard dimension used for some III-V solar cells such as Spectrolab's C4MJ cell. Other than an increase in the size of the device contact patterns, the device design, material synthesis, and fabrication were the same as in the previously reported smaller devices. FIG. 9A shows optical microscope and macroscopic photographs of these large-area devices. As shown, these devices are macroscale on the x-y plane while their active area was only sub-nanometer in thickness.

Figure 9B:
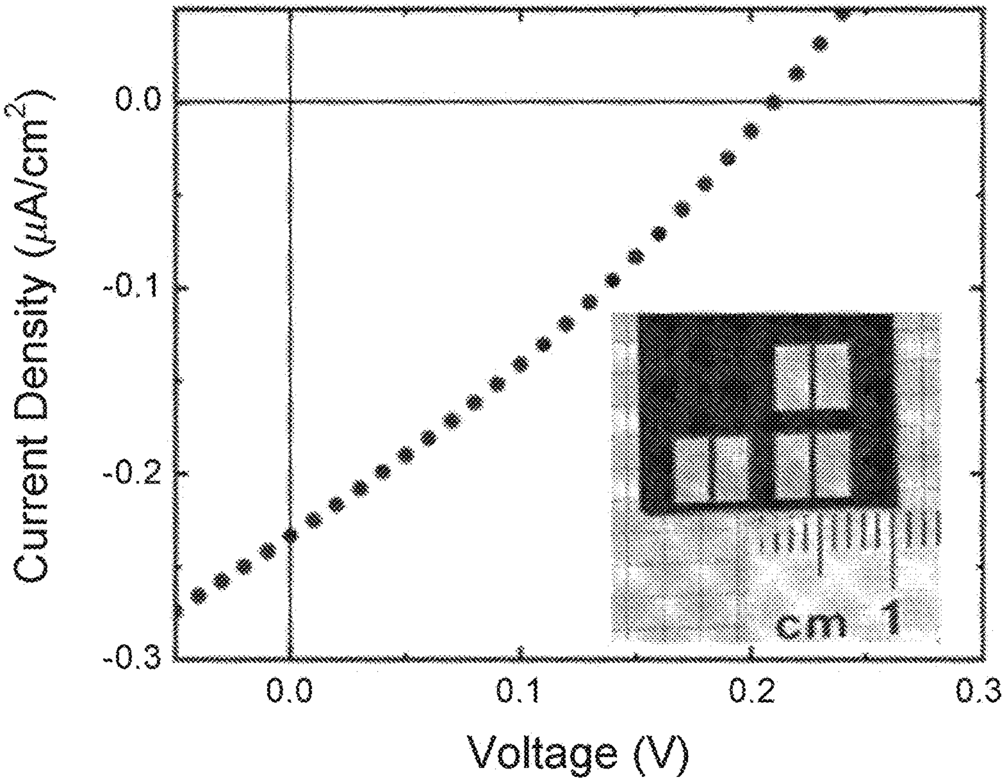
FIG. 9B is a plot of J-V of the large-area PV device of FIG. 9A under 1-sun equivalent AM1.5D illumination.

FIG. 9B shows the J-V performance of a typical large-area 2D PV device under 1-sun equivalent AM1.5D illumination. The channel length between the asymmetric Ti and Pt contacts is 3 μm. The inset of FIG. 9B is a photograph of three 25 $mm^2$ devices on a $SiO_2$-on-Si substrate; a ruler is shown in this photograph for scale. The open-circuit voltage $V_{oc}$ was 210 mV, the open circuit current was 0.23 $\mu A/cm^2$, the fill factor was 28.2%, and the efficiency was 0.00001%. These large-area devices generally have a higher open-circuit voltage $V_{oc}$ than their smaller area counterparts due in part to better perimeter passivation, but their short-circuit current density $J_{sc}$ is still limited by the carrier transport and collection constraints of their lateral transport architecture.

In other embodiments, the contact patterns are carefully designed, including the fingers' pitch and width, to prevent leakage or inactive portions of the device and to maximize the photogenerated carriers' collection.

Conclusion

In summary, the present disclosure comprises the design, modeling, fabrication, and characterization of CVD-grown monolayer $MoS_2$-based lateral Schottky-junction PV devices with asymmetric Ti and Pt contacts. The device performance was analyzed under monochromatic and 1-sun equivalent AM1.5D illumination sources. A typical device achieved an open-circuit voltage $V_{oc}$ of 160 mV and a short-circuit current density $J_{sc}$ of 0.01 $mA/cm^2$ while the best performing devices achieved a $V_{oc}$ and $J_{sc}$ of 290 mV and 0.02 $mA/cm^2$, respectively. To understand the low current in the devices, a resistance model was built and contact resistances were extracted from a TLM measurement, which showed very high sheet resistance. Further analysis of device behavior, including work function measurements, showed opportunities for near-term performance enhancement. A 2D PV optoelectronic model was built and validated by the experimental results; the model is then further expanded to design and project future device performance. By only optimizing the metal contact work functions and the carrier mobility of the 2D $MoS_2$ film, the model predicted a 0.65-nm-thick solar cell active material with ~70 kW/kg specific power, exceeding the 54 kW/kg record specific power of GaAs-based solar cell active material. Other embodiments comprise further thickness optimization and module encapsulation to achieve ultra-high-specific-power solar cells with these 2D TMDC materials. Finally, to prove the scalability of these devices towards large-area practical deployment, a 25 $mm^2$ active area cell was fabricated and characterized under 1-sun illumination. Initial results showed an open-circuit voltage $V_{oc}$ of 210 m V without optimization.

Film Synthesis and Transfer

The 2D $MoS_2$ films were synthesized in an MTI OTF-1200X-II dual zone split tube furnace with the addition of a low-temperature third zone by wrapping the tube with a Grainger SLR series silicone heating blanket. The ACS reagent, ≥99.5% molybdenum (VI) oxide ($MoO_3$) and the 99.98% trace metals basis sulfur(S) powder were purchased from Sigma-Aldrich. A surface-energy-assisted film transfer process was used to transfer the monolayer $MoS_2$ films from their sapphire growth substrate onto the PV device metal contacts on an $SiO_2$-on-Si substrate. Alternate transfer methods using an elastomeric stamp or other dry techniques, with or without pick-and-place automation, may also be used to achieve stacks of large numbers (up to 100 or more) of monolayers.

Device Fabrication

The device fabrication was carried out in this sequence: (i) substrate cleaning with solvents (acetone and IPA) and $O_2$ plasma, (ii) patterning for the Pt contacts using a RAITH VOYAGER 100 electron beam lithography (EBL) tool, (iii) 50 nm Pt deposition using an Angstrom Engineering Nexdep electron beam evaporation (EBE) tool at 0.5 Å/s rate, (iv)

2nd layer alignment EBL for the Ti contacts, (v) 50 nm Ti evaporation using the same EBE tool at 1 Å/s rate, (vi) immediate transfer of the monolayer $MoS_2$ film on top of the Pt and Ti contacts, and finally (vii) device annealing at 200° C. for 1 hour in ambient room atmosphere.

The following is a step-by-step process flow for fabricating 2D $MoS_2$-based Schottky-junction photovoltaic devices:

1. A 1 cm×1 cm $SiO_2$-on-Si substrate piece was cleaned with solvents (acetone and IPA), and dried with dry $N_2$, followed by descumming the sample in a plasma asher: 10 sccm $O_2$, 500 mTorr, 45 W, 60 seconds.
2. The sample was coated with 600 nm PMMA 950 A7. The spin coating recipe was a two-step process:
    a. Step 1:15 seconds, 500 rpm speed, 100 rpm acceleration
    b. Step 2:45 seconds, 4000 rpm speed, 500 rpm acceleration
3. The sample was baked at 180° C. for 90 seconds.
4. Next, the device patterns were written using electron beam lithography (EBL). The following process parameters were used in the RAITH VOYAGER 100 EBL tool.
    a. High current (HC) mode (typically 28 nA current), 50 kV beam, 60 μm aperture
    b. Dose: 650 $\mu C/cm^2$; area step size and line spacing: 5-20 nm; dwell time was calculated by the software using the measured current, set dose, and set area step size/line spacing.
    c. 500 μm write fields were used.
5. Once exposed, the sample was removed from the EBL tool and develop using the MIBK:IPA 1:3 developer for 30 seconds. Rinsed IPA on the sample to clean off the residual MIBK.
6. The sample was descummed lightly again before loading inside the electron beam evaporator with the following process recipe: 10 sccm $O_2$, 500 mTorr, 30 W, 5 seconds
7. 50 nm of Pt was deposited in an electron beam evaporator at 0.5 Å/s deposition rate. The chamber was pumped down to low 1E-6/high 1E-7 Torr base pressure before starting the deposition.
8. Next, excess metal and PMMA was lifted-off in a petri dish with acetone. Usually, pipettes are used for agitation but occasionally this step requires an ultrasonicator to lift off the metals.
9. EBL with 3-point alignment was performed next such that the next metal contacts, Ti in this case, are properly aligned to the already deposited Pt contacts. Steps #2 through #6 were repeated with the addition of 3-point alignment EBL.
10. 50 nm of Ti was deposited in an electron beam evaporator at 1 Å/s deposition rate. The chamber was pumped down low 1E-6 Torr base pressure before starting the deposition.
11. Excess metal and PMMA was lifted-off again in a petri dish with acetone.
12. The sample was descummed using the recipe given in step #1 immediately followed by transfer of monolayer $MoS_2$ films onto them. The synthesis of monolayer $MoS_2$ and the transfer process is known in the art.
13. The devices were finally annealed at 200° C. for 1 hour in air to complete the fabrication process.

Device Characterization

The device current-voltage relationships were measured using a Keithley 2450 sourcemeter. The 1-sun AM1.5D illumination conditions were simulated in a TS-Space Systems Unisim tunable solar simulator with two tunable lamps and three tunable LEDs. All measurements were performed at room temperature in air.

Combinations of Features

Features described above as well as those claimed below may be combined in various ways without departing from the scope hereof. The following examples illustrate possible, non-limiting combinations of features and embodiments described above. It should be clear that other changes and modifications may be made to the present embodiments without departing from the spirit and scope of this invention:

(A1) An optoelectronic device includes a thin film of a transition-metal dichalcogenide, a first electrode made of a first metal directly contacting the thin film, and a second electrode made of a second metal directly contacting the thin film. The first metal is selected from the group consisting of molybdenum, titanium, aluminum, tantalum, scandium, and yttrium. The second metal is selected from the group consisting of platinum, nickel, palladium, gold, and cobalt. One of the first and second metals forms an electron selective layer with the transition-metal dichalcogenide and the other of the first and second metals forms a hole selective layer with the transition-metal dichalcogenide.

(A2) In the optoelectronic device denoted (A1), the transition-metal dichalcogenide is molybdenum disulfide.

(A3) In either of the optoelectronic devices denoted (A1) and (A2), the transition-metal dichalcogenide is doped.

(A4) In either of the optoelectronic devices denoted (A1) and (A2), the transition-metal dichalcogenide is undoped.

(A5) In any of the optoelectronic devices denoted (A1) to (A4), the transition-metal dichalcogenide is an intrinsic or extrinsic n-doped semiconductor.

(A6) In the optoelectronic device denoted (A5), the first metal forms the electron selective layer and the second metal forms the hole selective layer.

(A7) In any of the optoelectronic devices denoted (A1) to (A4), the transition-metal dichalcogenide is an intrinsic or extrinsic p-doped semiconductor.

(A8) In the optoelectronic device denoted (A7), the first metal forms the hole selective layer and the second metal forms the electron selective layer.

(A9) In any of the optoelectronic devices denoted (A1) to (A8), the transition-metal dichalcogenide is an ambipolar semiconductor.

(A10) In any of the optoelectronic devices denoted (A1) to (A9), the thin film is a monolayer.

(A11) In any of the optoelectronic devices denoted (A1) to (A9), the thin film is multilayer.

(A12) In any of the optoelectronic devices denoted (A1) to (A11), the thin film was fabricated via chemical vapor deposition.

(A13) In any of the optoelectronic devices denoted (A1) to (A11), the thin film is an exfoliated flake.

(A14) In any of the optoelectronic devices denoted (A1) to (A13), the optoelectronic device further includes a substrate supporting the thin film, the first electrode, the second electrode, or any combination thereof.

(A15) In the optoelectronic device denoted (A14), the substrate supports the thin film. The thin film supports the first and second electrodes such that the thin film is located at least partially between the substrate and each of the first and second electrodes.

(A16) In either of the optoelectronic devices denoted (A14) and (A15), the substrate is silicon-dioxide-on-silicon, glass, sapphire, polyimide, or a combination thereof.

(A17) In any of the optoelectronic devices denoted (A1) to (A16), the optoelectronic device is configured as a transistor, photovoltaic cell, photodetector, or photoemitter.

(A18) In any of the optoelectronic devices denoted (A1) to (A17), the first and second electrodes contact the same face of the thin film.

(A19) In any of the optoelectronic devices denoted (A1) to (A17), the first and second electrodes contact opposite faces of the thin film.

(A20) In any of the optoelectronic devices denoted (A1) to (A19), the thin film has an area of 0.25 $cm^2$ or more.

(B1) An optoelectronic device includes a thin film of a transition-metal dichalcogenide, a plurality of first fingers made of a first metal and directly contacting the thin film to form an electron selective layer, and a plurality of second fingers made of a second metal and directly contacting the thin film to form a hole selective layer. The plurality of first fingers and the plurality of second fingers are interdigitated.

(B2) In the optoelectronic device denoted (B1), each of the plurality of first fingers forms a gap with each of its one or more nearest-neighbor fingers of the plurality of second fingers.

(B3) In the optoelectronic device denoted (B2), the gap is no greater than five times a diffusion length of carriers in the transition-metal dichalcogenide.

(B4) In either of the optoelectronic devices denoted (B2) and (B3), the gap is five microns or less.

(B5) In any of the optoelectronic devices denoted (B1) to (B4), the thin film is a monolayer.

(B6) In any of the optoelectronic devices denoted (B1) to (B4), the thin film is multilayer.

(B7) In any of the optoelectronic devices denoted (B1) to (B6), the thin film was fabricated via chemical vapor deposition.

(B8) In any of the optoelectronic devices denoted (B1) to (B6), the thin film is an exfoliated flake.

(B9) In any of the optoelectronic devices denoted (B1) to (B8), the transition-metal dichalcogenide is an intrinsic or extrinsic n-doped semiconductor.

(B10) In any of the optoelectronic devices denoted (B1) to (B8), the transition-metal dichalcogenide is an intrinsic or extrinsic p-doped semiconductor.

(B11) In any of the optoelectronic devices denoted (B1) to (B8), the transition-metal dichalcogenide is an ambipolar semiconductor.

(B12) In any of the optoelectronic devices denoted (B1) to (B11), the transition-metal dichalcogenide is molybdenum disulfide.

(B13) In any of the optoelectronic devices denoted (B1) to (B12), the optoelectronic device further includes a substrate supporting the thin film, the plurality of first fingers, the plurality of second fingers, or any combination thereof.

(B14) In the optoelectronic device denoted (B13), the substrate supports the thin film. The thin film supports the plurality of first fingers and the plurality of second fingers.

(B15) In any of the optoelectronic devices denoted (B1) to (B14), the optoelectronic device is configured as a transistor, photovoltaic cell, photodetector, or photoemitter.

(B16) In any of the optoelectronic devices denoted (B1) to (B14), the thin film has an area of 0.25 $cm^2$ or more.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. An optoelectronic device, comprising:

a thin film of a transition-metal dichalcogenide;

a first contact directly contacting the thin film; and a second contact directly contacting the thin film;

wherein the transition-metal dichalcogenide is free of a p-n junction and further wherein one of the first and second contacts is configured to induce band bending in the transition-metal dichalcogenide to form an electron selective layer and an other of the first and second contacts is configured to induce opposite band bending in the transition-metal dichalcogenide to form a hole selective layer, wherein the band bending and the opposite band bending induced by the first and second contacts drives separation of carriers within the transition-metal dichalcogenide.

2. The optoelectronic device of claim 1, wherein the first contact comprises a first metal selected from the group consisting of molybdenum, titanium, aluminum, tantalum, scandium, and yttrium and the second contact comprises a second metal selected from the group consisting of platinum, nickel, palladium, gold, and cobalt.

3. The optoelectronic device of claim 2, wherein the transition-metal dichalcogenide is n-type.

4. The optoelectronic device of claim 3, wherein the first contact induces band bending in the transition-metal dichalcogenide to form the electron selective layer and the second contact induces opposite band bending in the transition-metal dichalcogenide to form the hole selective layer.

5. The optoelectronic device of claim 2, wherein the transition-metal dichalcogenide is p-type.

6. The optoelectronic device of claim 5, wherein the first contact induces band bending in the transition-metal dichalcogenide to form the hole selective layer and the second contact induces opposite band bending in the transition-metal dichalcogenide to form the electron selective layer.

7. The optoelectronic device of claim 1, wherein the transition-metal dichalcogenide is ambipolar.

8. The optoelectronic device of claim 1, further comprising:

a plurality of first fingers comprising the first contact; and a plurality of second fingers comprising the second contact;

wherein the plurality of first fingers and the plurality of second fingers are interdigitated.

9. The optoelectronic device of claim 8, wherein each of the plurality of first fingers forms a gap with each of its one or more nearest-neighbor fingers of the plurality of second fingers.

10. The optoelectronic device of claim 9, wherein the gap is no greater than five times a diffusion length of the carriers in the transition-metal dichalcogenide.

11. The optoelectronic device of claim 9, wherein the gap is five microns or less.

12. The optoelectronic device of claim 1, wherein the thin film is a monolayer of the transition-metal dichalcogenide.

13. The optoelectronic device of claim 1, wherein the thin film is a multilayer of the transition-metal dichalcogenide.

14. The optoelectronic device of claim 1, wherein the thin film has an area of 0.25 $cm^2$ or more.

15. The optoelectronic device of claim 1, wherein the thin film has a first surface and a second surface opposite the first surface and the first contact and the second contact are directly on the first surface such that they are on a same face of the thin film.

16. The optoelectronic device of claim 15, wherein the first contact comprises a first metal selected from the group consisting of molybdenum, titanium, aluminum, tantalum, scandium, and yttrium and the second contact comprises a second metal selected from the group consisting of platinum, nickel, palladium, gold, and cobalt.

17. The optoelectronic device of claim 1, wherein the transition-metal dichalcogenide is $MoS_2$, and further wherein the first contact comprises a first metal selected from the group consisting of molybdenum, titanium, aluminum, tantalum, scandium, and yttrium and the second contact comprises a second metal selected from the group consisting of platinum, nickel, palladium, gold, and cobalt.

18. The optoelectronic device of claim 17, wherein the $MoS_2$ is n-type and the first contact induces band bending in the $MoS_2$ to form the electron selective layer and the second contact induces opposite band bending in the $MoS_2$ to form the hole selective layer, and further wherein the first metal is titanium and the second metal is platinum.

19. The optoelectronic device of claim 17, wherein the $MoS_2$ is p-type and the first contact induces band bending in the $MoS_2$ to form the hole selective layer and the second contact induces opposite band bending in the $MoS_2$ to form the electron selective layer.

20. The optoelectronic device of claim 17, wherein the thin film has a first surface and a second surface opposite the first surface and the first contact and the second contact are directly on the first surface such that they are on a same face of the thin film.

* * * * *